(12) United States Patent　　(10) Patent No.: US 9,276,573 B2
Gaillardon et al.　　(45) Date of Patent: Mar. 1, 2016

(54) HIGH-PERFORMANCE LOW-POWER NEAR-VT RESISTIVE MEMORY-BASED FPGA

(71) Applicant: ECOLE POLYTECHNIQUE FEDERALE DE LAUSANNE (EPFL), Lausanne (CH)

(72) Inventors: Pierre-Emmanuel Gaillardon, Renens (CH); Xifan Tang, Lausanne (CH); Giovanni De Micheli, Lausanne (CH)

(73) Assignee: ECOLE POLYTECHNIQUE FEDERALE DE LAUSANNE, Lausanne (CH)

( * ) Notice: Subject to any disclaimer, the term of this patent is extended or adjusted under 35 U.S.C. 154(b) by 0 days.

(21) Appl. No.: 14/444,422

(22) Filed: Jul. 28, 2014

(65) Prior Publication Data

US 2016/0028396 A1　　Jan. 28, 2016

(51) Int. Cl.
*H03K 19/177*　　(2006.01)
*H03K 19/00*　　(2006.01)
*H03K 19/094*　　(2006.01)

(52) U.S. Cl.
CPC ........ *H03K 19/0013* (2013.01); *H03K 19/0941* (2013.01); *H03K 19/1774* (2013.01); *H03K 19/1776* (2013.01); *H03K 19/17728* (2013.01)

(58) Field of Classification Search
CPC ............ H03K 19/177; H03K 19/1776; H03K 19/17736; H03K 19/17728
USPC ................................................ 326/38, 41, 47
See application file for complete search history.

(56) References Cited

U.S. PATENT DOCUMENTS 7,852,114 B2 * 12/2010 Bertin et al. .................... 326/38

* cited by examiner

*Primary Examiner* — Daniel D Chang
(74) *Attorney, Agent, or Firm* — Hoffman Warnick LLC

(57) ABSTRACT

A Field Programmable Gate Array (FPGA) of the island-type comprising a plurality of cluster-based Configurable Logic Blocks (CLBs), whereby each of the cluster-based CLBs is surrounded by a global routing structure formed by a plurality of multiplexers and pass/transmission-gates organized in Switch Boxes (SBs) and Connection Blocks (CBs), the switch boxes and the connection blocks comprising at least a first plurality of resistive memories inserted in a data path of a first routing architecture of the switch boxes and the connection blocks. Each CLB contains Basic Logic Elements (BLEs), as well as local routing resources.

8 Claims, 11 Drawing Sheets

HIGH-PERFORMANCE LOW-POWER NEAR-VT RESISTIVE MEMORY-BASED FPGA

TECHNICAL FIELD

The present invention is in the field of Field Programmable Gate Arrays (FPGAs).

BACKGROUND

Field Programmable Gate Arrays (FPGAs) are more flexible than Application-Specific Integrated Circuits (ASICs) at the cost of 20× bigger area, 4× longer delay, and 12× higher power consumption approximately [1]. The drawbacks of FPGAs lie in the expensive routing architecture, which accounts for about 70% of the area, 80% of the delay and 60% of the power of the whole chip [2]. Power consumption is a serious barrier for the distribution of FPGAs in a large set of consumer applications. Prior art publications [3]-[5] demonstrate low-power FPGA designs where a low supply voltage is employed to save up to 50% of the power consumption. However, low-power FPGAs generally suffer from large delay degradation (up to 2×).

Resistive Memories (RMs) [6], a member of Non-Volatile Memory (NVM) family [7], open opportunities in advancing the FPGA technology with high density, instant power-on and excellent energy efficiency. Overwhelming Static Random Access Memories (SRAMs) intrinsically, RMs hold storage when powered down and consume less leakage power. Besides, RMs can be fabricated between the Back-End-Of-Line (BEOL) metal lines, moving the configuration memories onto the top of the transistors, thereby improving the integration density. Using RMs as standalone memories, FPGAs can benefit a ~50% power reduction from instant power-on and normal power-off, compared to SRAM-based counterparts [8]. Furthermore, RMs motivate the exploration of novel FPGA architectures whose routing structures are directly employing RMs in the data path. In the novel architectures, RMs play the role of both configurable memories and programmable switches. Previous works [9]-[12] demonstrate significant improvements in area, delay and power. The BEOL integration leads to area-savings and the Low-Resistance State (LRS) of RMs (down to 75% lower on-resistance than pass transistors) reduces the delay of critical path. Finally, a power efficiency comes from zero leakage power in sleep mode.

SUMMARY

The present patent application aims at the fabricating of a low-power RM-based FPGA. The performances of RM-based routing architecture are less sensitive to a supply voltage Vdd reduction as compared to pass transistors. Hence, RM-based high-performance routing structures are appealing to compensate the traditional delay degradation found in low-power FPGAs, while maintaining a high power efficiency. Therefore, we propose a near-Vt RM-based FPGA design (Vt is the threshold voltage of the transistor—near-Vt refers to the voltage operation point close to the transistor's Vt), combining both power-efficiency and performance. Architectural-level simulations show that near-Vt RM-based FPGA gives a 15% area gain, a 10% delay gain and a 65% power gain, compared to the baseline FPGA architecture. To achieve low on-resistance values, RMs typically require high programming currents. To drive such high currents, large programming transistors are needed, and they potentially result in area, delay and power inefficiencies. Hence, we investigate the impact of the size of programming transistors in RM-based multiplexers in terms of Energy-Delay Product (EDP). Electrical simulations reveal that at near-Vt supply voltage, RM-based multiplexers with non-uniform programming transistor sizing produce better EDP than those with uniform sizing. Architectural-level simulations show that non-uniform programming transistor sizing further contributes to 18% area gain and 2% delay gain compared to the initial near-Vt RM-based FPGA.

In a first aspect, the invention provides a Field Programmable Gate Array (FPGA) of the island-type comprising a plurality of cluster-based Configurable Logic Blocks (CLBs), whereby each of the cluster-based CLBs is surrounded by a global routing structure formed by a plurality of multiplexers and pass/transmission-gates organized in Switch Boxes (SBs) and Connection Blocks (CBs), the switch boxes and the connection blocks comprising at least a first plurality of resistive memories inserted in a data path of a first routing architecture of the switch boxes and the connection blocks. Each CLB contains Basic Logic Elements (BLEs), as well as local routing resources. Each one of the local routing resources comprising at least a local routing multiplexer or a crossbar which route signals from the CLB inputs and the BLE outputs to the BLE inputs, each local routing multiplexer or crossbar comprising at least a plurality of Resistive Memories (RMs) inserted in a data path of a routing architecture of the local routing multiplexer, and each switch box and connection block comprises at least a group of the plurality of multiplexers, arranged to realize at least an interconnection.

In an illustrative embodiment each BLE comprises at least a Look-Up Table (LUT), a D Flip-Flop (DFF), and a corresponding multiplexer, which selects either a combinational version or a sequential version of the LUT output, each LUT being based on at least a plurality of non-volatile scan-chain SRAMs connected in series, and the corresponding multiplexer comprising at least a second plurality of Resistive Memories (RMs) inserted in a data path of a second routing architecture of the corresponding multiplexer.

In a further illustrative embodiment the LUT comprises a decoding multiplexer exploiting standard CMOS techniques and transistors and a plurality of storage elements exploiting at least a plurality of resistive memories, the decoding multiplexer being configured to route information of one of the plurality of storage elements to the LUT output, each one of the plurality of the storage elements comprises a flip-flop structure or a scan chain SRAM exploiting standard CMOS techniques and transistors combined with a plurality of resistive memories.

In a further illustrative embodiment, for each multiplexer from the plurality of multiplexers forming the global routing structure, from the corresponding multiplexer related to each BLE, and from the local routing multiplexer of the local routing resources, the plurality of resistive memories are organized in a tree based hierarchy. The field programmable gate array further comprises a plurality of programming transistors providing an access to the resistive memories during the programming phase.

In a second aspect the invention provides a method for configuring a Resitive Memory (RM) in the field programmable gate array of the invention according to the first aspect or any preferred embodiment thereof. The method comprises steps of serially loading a program bitstream to programming scan-chain SRAMs, sequentially configuring each stage of the resistive memory based multiplexer, when a determined program bit is loaded in the programming scan-chain SRAMs for a determined stage, turning on a corresponding programming transistor of the RM, and turning off the corresponding programming transistor after programming. A programming voltage $V_{prog}$ for the RM is larger than a supply voltage Vdd according to the following equation:

$$V_{prog}=\lambda \cdot Vdd$$

wherein a value of $\lambda$ must be set according to $\lambda>1$.

In a further embodiment the method further comprises setting $\lambda$ to 1.2, thereby providing a slack of 20% between Vdd and $V_{prog}$.

In a further embodiment, the method further comprises a sizing of the programming transistor to obtain an optimal size of the programming transistor, the sizing involving determining the size of buffers (Winv) that drive the multiplexer, a capacitive load ($C_L$) of this multiplexer and the programming voltage (Vprog); determining the number of stages of the multiplexer; extracting process parameters (Ids, Rmin, Coff) of a transistor intended for use in a circuit design of the RMs; and applying applying $$W_{prog,opt} = \sqrt{\frac{nV_{prog}C_L W_{inv}}{(2n+1)I_d R_{min}C_{off}}}$$

to identify an optimal value of a width of the programming transistor (Wprog,opt), wherein $R_{min}$ denotes the equivalent resistance of a minimum size inverter, $C_{off}$ is the parasitic capacitance of a minimum width programming transistor in off state, $I_d$ is the driving current of a minimum width transistor, n is the number of stages of resistive memories on which the multiplexer is based.

DESCRIPTION OF THE DRAWINGS

The invention will be better understood in the light of the description of preferred embodiments and in view of the figures, wherein FIG. 1 contains an illustration of a conventional FPGA architecture according to prior art.

DETAILED DESCRIPTION

In this section, we review the necessary background of conventional FPGA architectures as well as RM-based FPGA architectures.

A. Conventional FPGA Architecture

Figure 1:
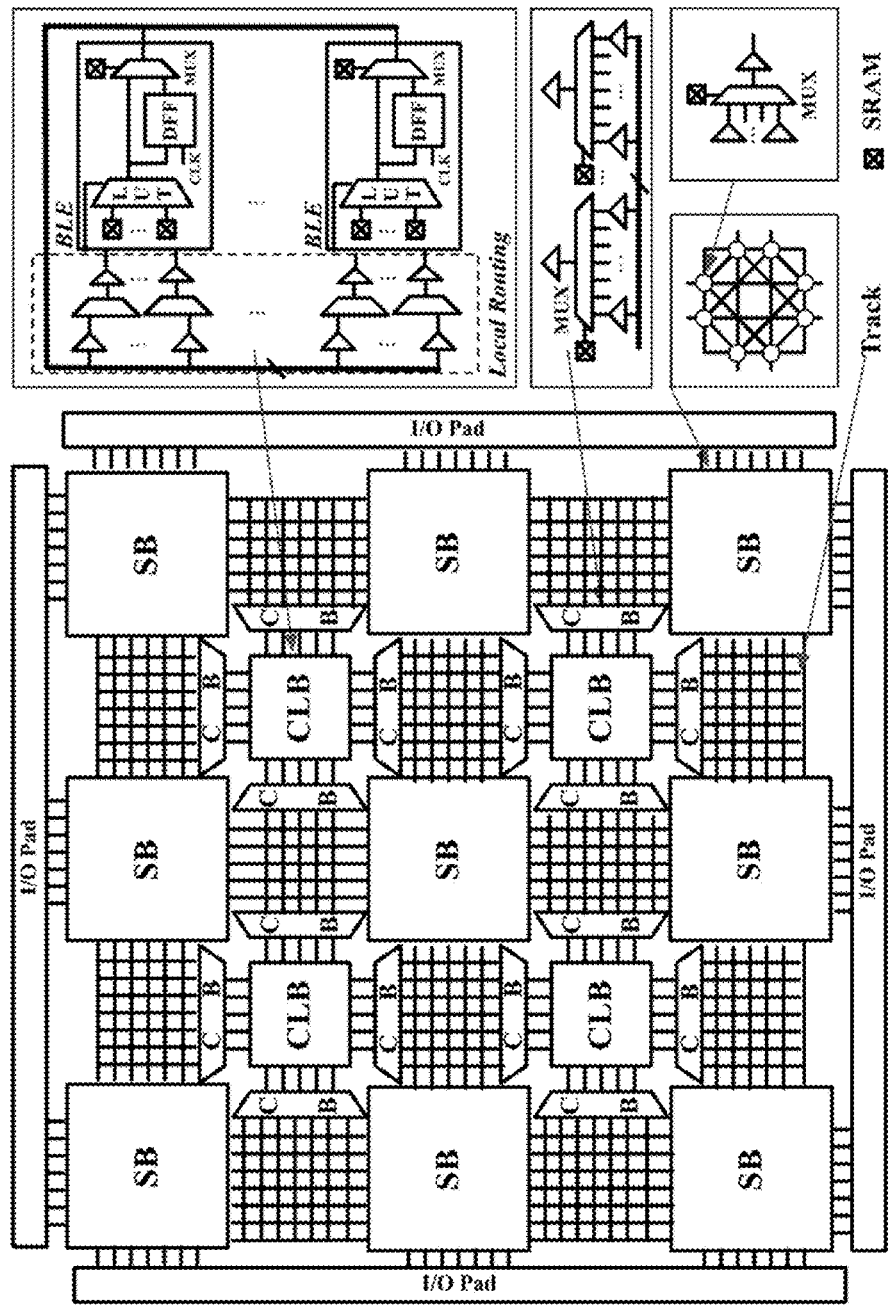

FIG. 1 depicts the conventional FPGA architecture with single-driver routing [15], where Configurable Logic Blocks (CLBs) are surrounded by routing resources, such as Switch Boxes (SBs) and Connection Blocks (CBs). A CLB contains logic resources, called Basic Logic Elements (BLEs), as well as routing resources, denoted as local routing. A BLE consists of a Look-Up Table (LUT), a D Flip-Flop (DFF) and a 2-input multiplexer, which selects either the combinational or sequential version of the LUT output. SBs and CBs consist of groups of multiplexers, that can realize any interconnection as long as there are enough routing tracks. FPGA performance is influenced by the number of LUT inputs, denoted K, the number of BLEs in a CLB, denoted N, and the number of inputs of a CLB, denoted I. Previous works [13] [14] conclude that I=K(N+1)/2 ensures over 98% utilization of CLBs. Commercial FPGAs [16]-[18] widely support fracturable LUTs [19] to reduce the critical path. In the present description, we typically consider FPGA consisting of K=6 fracturable LUTs organized in logic blocks described by N=10, I=33.

B. RM Technology

Figure 2:
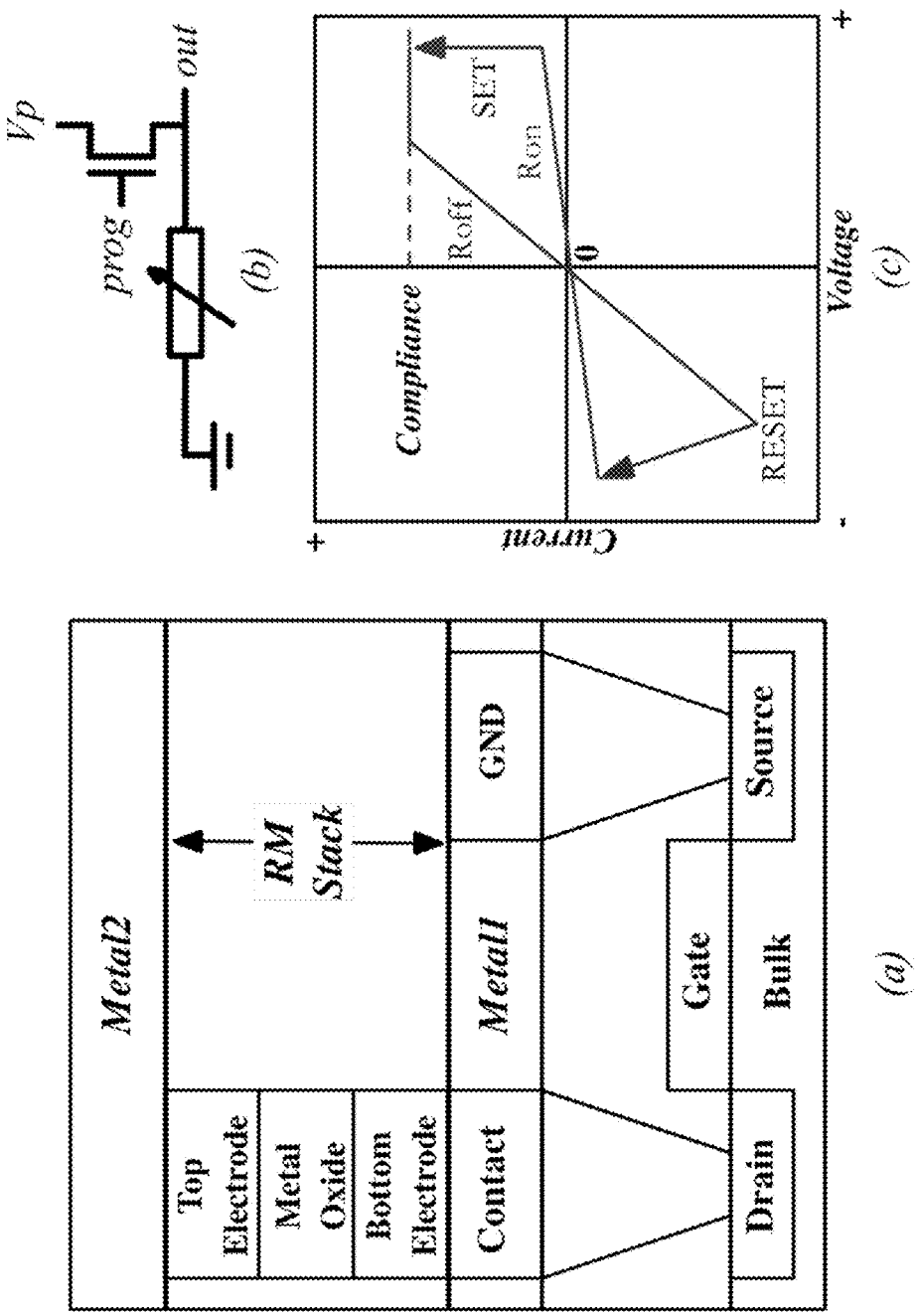
FIG. 2(a) illustrates a BEOL integration of RM between metal layers according to prior art.
FIG. 2(b) illustrates an example for implementing a 1T1R structure according to prior art.
FIG. 2(c) contains an I-V characteristics of a bipolar RM according to prior art.

As one of the most promising emerging NVM memories [7], RM technologies have been widely investigated [6]. As shown in FIG. 2(a), RMs are two-node electronic devices and typically consist of three layers: the top electrode, the metal oxide and the bottom electrode. RMs can be programmed into two stable resistance states, a Low Resistance State (LRS) and a High Resistance State (HRS) respectively by modifying the conductivity of metal oxide. When a programming voltage is applied between the electrodes, the metal oxide sees a conductivity change which leads to the switch of the resistance states. Switching mechanisms can be categorized into Unipolar Resistive Switching (URS) and Bipolar Resistive Switching (BRS) [6]. In the present description, we focus on BRS whose I-V characteristics are illustrated in FIG. 2(c). A positive programming voltage sets the RM in LRS while a negative one resets the RM in HRS. The on-resistance of RM is typically dependent on the programming current passing through the RM [20]. The higher programming current we drive, the lower on-resistance RM we obtain. Note that during the SET process, a current compliance is often enforced to avoid permanent breakdown of the device. FIG. 2(b) shows a 1T1R structure, where the programming transistor provides SET/RESET voltages as well as a current compliance. Back-End-Of-Line (BEOL) technology allows RM to be fabricated on the top of or between metal layers, saving chip area. FIG. 2(a) illustrates the BEOL integration of RMs corresponding to 1T1R programming scheme in FIG. 2(b).

C. RM-based FPGA Architecture

FPGA architecture can benefit from the non-volatility as well as the area and performance gains coming from the BEOL integration and the low on-resistance values achieved by RMs. To improve the LUTs, SRAMs can be simply replaced with voltage divider-like RM structures [11]. However, more opportunities lie in the routing architecture where not only SRAMs but also pass-transistors can be improved with RMs [9]-[12], thereby increasing the performances significantly. When programmed in LRS, RMs introduce about 75% less resistance in the data-path, compared to pass transistors. Works in [9]-[10] propose novel routing architecture exploiting RM-based programmable switches while [11]-[12] explore the architectural-level potential of RM-based multiplexers. To reduce the impact of the programming switches, programming transistor sharing is heavily studied in [9]-[10] for area-saving purpose but requires complicated programming operation. In [11], the programming complexity is reduced by exploiting the physical properties of RMs.

Each Near-Vt RM-Based FPGA

In this section, we describe an example embodiment of the a RM-based FPGA circuit design according to the invention. Furthermore we explore its use in near-Vt regime.

1) RM-Based FPGA

The RM-based FPGA described in the present patent application is similar in respect to its architecture to the conventional SRAM-based FPGA shown in FIG. 1. It remains an island-style FPGA where the cluster-based CLBs are surrounded by SBs and CBs.

Figure 3:
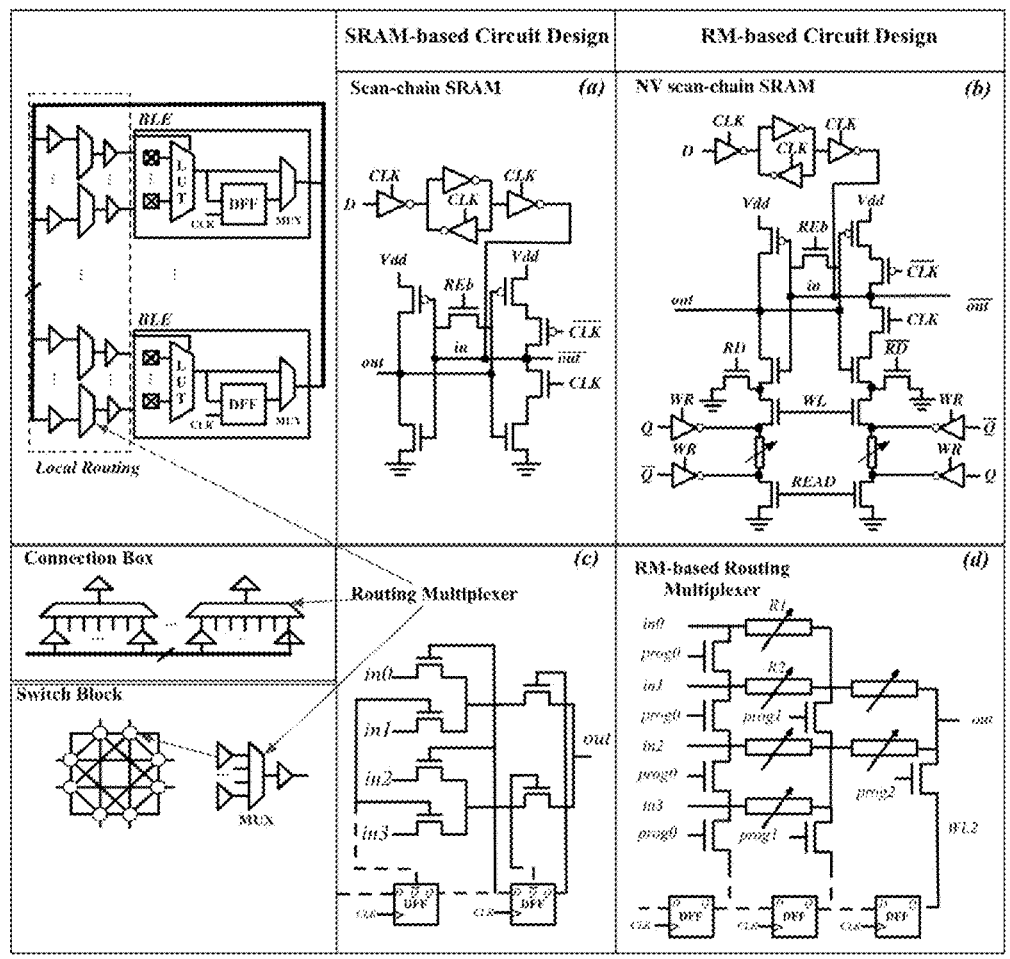
FIG. 3 show a comparison between SRAM-based FPGA and RM-based FPGA.

The differences between the RM-based FPGA and rh SRAM based FPGA lie in the circuit design of those modules heavily relying on LUTs and multiplexers. FIG. 3 compares the circuit designs of LUT and multiplexer between a conventional SRAM-based FPGA and the RM-based FPGA according to the invention described in the present document.

In the FPGA according to the invention, the logic elements exploit Non-Volatile (NV) LUTs. Such FPGA does not need to be re-programmed during each power on and can benefit instant-on and normally-off properties.

A prior art LUT typically consists of a bank of SRAMs and a multiplexer. The SRAM bank stores a truth table which is decoded by the multiplexer, enabling the LUT to realize any logic function.

According to the invention, we replace the scan-chain SRAMs (FIG. 3(a)) in LUTs with Non-Volatile (NV) scan-chain SRAMs borrowed from previous work [22]. The multiplexers in LUTs are still implemented by pass-transistors considering that their decoding results keep changing when the FPGA is operating.

If RMs are inserted in the data path of LUTs for decoding, their programming speed will drastically limit frequency. Compared to SRAM-based, the NV LUTs have no difference in performance because of the same decoder implementation. Data path DFFs are also Non-Volatiled with the same circuit elements. These FFs operate as standard volatile CMOS FF during regular operation but they are also capable to store the data non-volatily on demand before a sleep period. Data stored in the NV DFFs can then be restored during wake up. In these flip-flops, RMs are written only before the sleep period. These events have very low frequency and are compatible with the endurance capabilities of RMs.

While the decoded paths of the LUT multiplexer change at runtime, the selected paths in the routing multiplexers (i.e., in BLE output selector, local routing, SBs and CBs) remain unchanged during the runtime. Therefore, RMs can be inserted in the data path of routing architecture without challenging the endurance. FIG. 3(d) illustrates the RM-based multiplexer [11] which replaces the SRAM-based multiplexer shown in FIG. 3(c). RM-based multiplexers take advantage of the Bipolar Resistive Switching (BRS) in order to share programming transistors and achieve area-efficiency [11]. As shown in FIG. 3(d), each pair of RMs (e.g., R1 and R2) can be programmed in either HRS+LRS or LRS+HRS in one step. Compared to the SRAM-based multiplexers, the RM-based multiplexers exhibit high performances accounted to the low on-resistance of the RMs introduced in the data path. However, a low on-resistance of the RMs means high programming currents. In other words, they need large programming transistors which potentially introduce large parasitic capacitance to the data paths and result in area and delay in-efficiencies.

2) Impact of Vdd Reduction on RM-Based Routing Architecture

In conventional SRAM-based low-power FPGAs, a reduction of the supply voltage down to near/sub-Vt regime trades off power reduction with delay degradation. In RM-based FPGAs, logic elements such as LUTs and DFFs rely on the same circuit topologies. Therefore, their performances degrade when supply voltage reduces to near/sub-Vt regime. However, routing architectures in the RM-based FPGA exploit RMs in the data paths and may perform differently compared to SRAM-based when supply voltage changes. Hence, in this part, we study the impact of supply voltage on the performances of RM-based routing architecture.

Electrical simulations are performed in a commercial 0.18 μm technology. Nowadays, low-power near/sub-Vt designs are implemented with mature technology node for better leakage characteristics and reliability. Nevertheless, the approach introduced in the present description is general and can lead to the same conclusion under other technology nodes. We also consider RM device parameters, $R_{on}$=1 kΩ and $R_{off}$=1 MΩ in [23].

Figure 4:
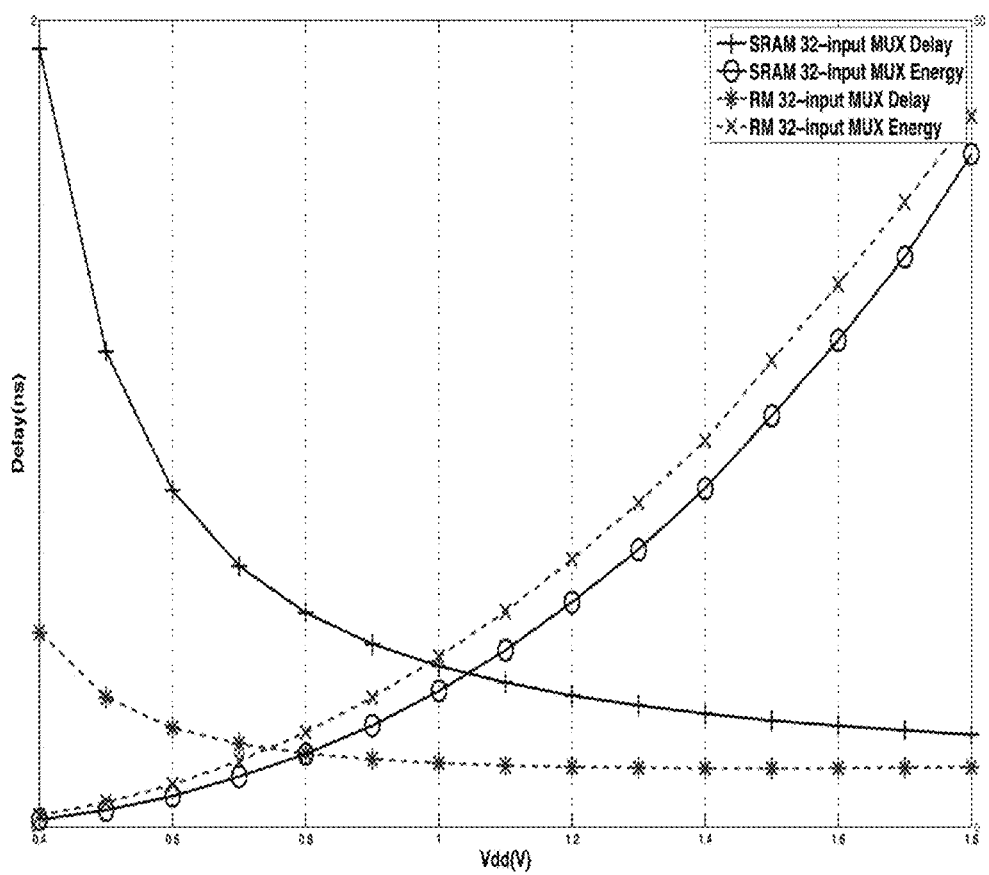
FIG. 4 contains a graph illustrating energy and delay evaluation of 32-input SRAM-based and RM-based multiplexers under Vdd reductions.

The FPGA routing architecture consists of multiplexers of different sizes, which appear in local routing, CBs and SBs. Here, we consider a local 32-input multiplexer. For the multiplexers of other sizes, the same conclusions can be reached. FIG. 4 compares the delay and power between a 32-input SRAM-based multiplexer and its RM-based counterpart when Vdd ranges from 0.4 V to 1.8 V. Both RM-based and SRAM-based multiplexers reduce power but suffer from delay degradation when Vdd decreases. Generally, RM-based multiplexer consumes slightly more power than SRAM-based due to the low on-resistance of RMs in data paths. However, SRAM-based FPGA routing architecture suffers serious delay degradation when Vdd decreases. In contrast, RM-based FPGA routing architecture benefit the same power reduction but with very moderate delay degradation. The different trends in delay degradations are accounted to the low on-resistance of RMs which is achieved independently from Vdd, while on-resistance of pass transistors increase sharply when Vdd decreases. Furthermore, the parasitic capacitances brought by the programming transistors do not vary significantly until Vdd drops to sub-Vt regime. Therefore, the delay of RM-based multiplexer in near-Vt regime remains as they are at Vdd=1.8 V since its RC characteristic does not change. When Vdd drops to sub-Vt regime, RM-based multiplexer has serious delay degradation as well due to parasitic capacitances of programming transistors increase. FIG. 4 shows us to select a proper Vdd in the near-Vt regime. Hence, the RM-based FPGA will achieve both low-power and high-performance. The high-performance RM-based routing architectures are expected to compensate the delay degradation in the logic elements, and even reduce the overall critical path delay.

3) Configuring RMs in FPGAs

In SRAM-based FPGAs, SRAMs bits are configured by scan-chain SRAMs, as shown in FIG. 3(a). All scan-chain SRAMs are connected in series (i.e., dash lined in FIG. 3(c)) and the program bitstream is serially loaded to the scan-chain SRAMs until all SRAM bits are configured. In RM-based FPGAs, scan-chain SRAMs in logic elements are adapted to the NV scan-chain SRAMs as shown in FIG. 3(b). Each stage of the RM-based multiplexer (FIG. 3(d)) is configured sequentially [12]. When the program bit is loaded in the scan-chain SRAMs for a certain stage, the corresponding programming transistors are turned on. After programming, these programming transistors are turned off. In the RM-based FPGA, RMs in the data paths should not be mistakenly programmed when transmitting signals. This critical concern is avoided by ensuring that the programming voltage $V_{prog}$ for RMs is larger than supply voltage Vdd, as shown in equation (1):

$$V_{prog} = \lambda \cdot Vdd, \lambda > 1 \quad (1)$$

In a preferred embodiment, we set λ to 1.2, to provide 20% slack between Vdd and $V_{prog}$. The $V_{prog}$ parameter can be easily adjusted by tuning the RM stack geometries [6]. Note that Vdd is expected to be near-Vt. Therefore $V_{prog}$ will stay in a regular range, i.e., super threshold, of the MOS transistors, that can be used as is.

Programming Transistor Sizing

In this section, we describe the impact of programming transistor size on the performance of RM-based routing architecture. estimate Their optimal size is estimated and it is verified by electrical simulations.

A. Impact of Programming Transistor Size

In previous works [9]-[12], the sizes of programming transistors are considered uniform to achieve the lowest on-resistance of RM, which is assumed to produce the best performance of RM-based interconnects. Actually, the delay of RM-based programmable interconnects is determined by various factors, such as the size of the driving inverter, the parasitic capacitance of programming transistors, and the resistance of the RMs. Hence, as the on-resistance value is strongly correlated with the size of the programming transistors [6], there is no guarantee that using the lowest possible on-resistance will give the lowest delay. In this section, we focus on the impact of programming transistor size on the delay of RM-based multiplexers. Note that the methodology developed here is not dependent on the considered RM technology or on the transistor technology nodes, but is rather general.

Figure 5:
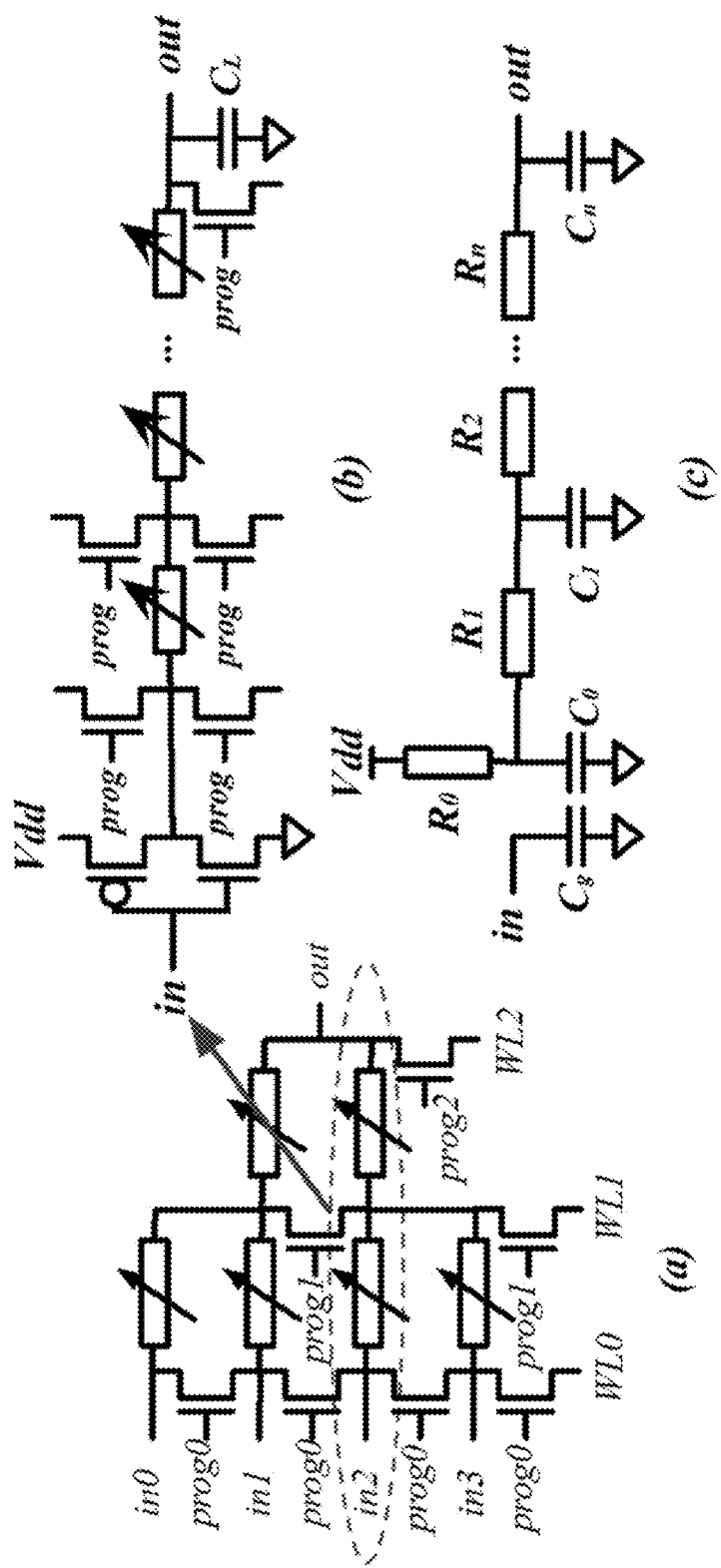
FIG. 5(a) illustrates a critical path of 4-input RM-based multiplexer.
FIG. 5(b) illustrates a general critical path of RM-based multiplexer.
FIG. 5(c) contains an equivalent RC model.

The critical path of a RM-based multiplexer is the path from an input to the output which contains the largest number of RMs in the on-resistance state and the largest number of programming transistors. For instance, the highlighted path in FIG. 5(a) is the critical path of a 4-input RM-based multiplexer. FIG. 5(b) extends this to the general case of a n-stage RM-based multiplexer, while its equivalent RC model is given in FIG. 5(c).

The resistance and capacitance in FIG. 5(c) can be extracted from FIG. 5(b) and expressed as follows:

$$R_0 = R_{inv} = \frac{R_{min}}{W_{inv}}, \quad (2)$$

$$R_i \mid 1 \leq i \leq n = R_{on},$$

$$C_0 = W_{inv}C_{inv} + 2W_{prog}C_{off},$$

-continued $$C_i \mid 1 \leq i \leq n = 2W_{prog}C_{off},$$

$$C_n = C_L + W_{prog}C_{off}$$

where $R_{min}$ denotes the equivalent resistance of a minimum size inverter, $C_{inv}$ represents the parasitic capacitance at the output of a minimum size inverter, $W_{inv}$ is the size of driving inverter in terms of the minimum width transistor [13]. $R_{on}$ denotes the equivalent resistance of a RM in on-resistance state. $W_{prog}$ represents the width of programming transistor in the unit of the minimum width transistor, and $C_{off}$ is the parasitic capacitance of a minimum width programming transistor in off state.

Considering the Elmore delay [24] of the critical path of a general n-stage RM-based multiplexer (FIG. 5(b)), we obtain:

$$\tau = \sum_{i=0}^{n} R_i \sum_{j=i}^{n} C_j \quad (3)$$

$$R_{min}C_{min} + \frac{R_{min}}{W_{inv}}C_L + (2n+1)\frac{R_{min}}{W_{inv}}W_{prog}C_{off} + n \cdot R_{on}C_L +$$

$$n^2 R_{on} W_{prog} C_{off}$$

As introduced previously, the on-resistance $R_{on}$ of RM is dependent on the programming voltage $V_{prog}$ and on the programming current $I_{prog}$ [6], as follows:

$$R_{on} = \frac{V_{prog}}{I_{prog}} = \frac{V_{prog}}{W_{prog} \cdot I_d} \quad (4)$$

where $I_d$ is the driving current of a minimum width transistor. With equation (4), equation (3) is converted to:

$$\tau = R_{min}C_{inv} + \frac{R_{min}}{W_{inv}}C_L + \quad (5)$$

$$(2n+1)\frac{R_{min}}{W_{inv}}W_{prog}C_{off} + n \cdot \frac{V_{prog}}{I_d W_{prog}}C_L + n^2 \frac{V_{prog}}{I_d}C_{off}$$

Figure 6:
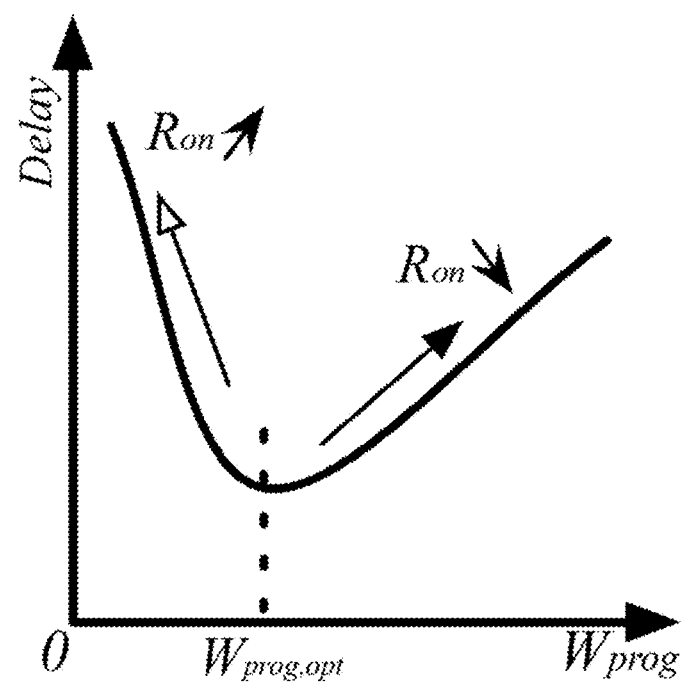
FIG. 6 contains a graph illustrating a relation between $W_{prog}$ and delay of a RM-based multiple.

The relation between the n-stage multiplexer delay and the width of the programming transistor is depicted in FIG. 6.

When $W_{prog}$ is small, the delay increases due to the large on-resistance of RM. When $W_{prog}$ is large, the delay increases as well. Indeed, while the on-resistance is reduced, large parasitic capacitances are introduced by the programming transistors and limit the performances. Therefore, as shown in FIG. 6, there exists an optimal $W_{prog,opt}$ giving the best performances by trading off the on-resistance with the parasitic capacitances from the programming transistors. Equation (5) reaches minimum value (best delay) when:

$$W_{prog,opt} = \sqrt{\frac{nV_{prog}C_L W_{inv}}{(2n+1)I_d R_{min} C_{off}}} \quad (6)$$

In FPGA routing architecture, the number of the stages of multiplexers are diverse. As Equation 6 depends on the size n of the multiplexer, using a uniform size of programming transistors [9]-[12] does not ensure the best performance. To achieve the best performances, the multiplexers in FPGA should have different $W_{prog,opt}$. Note that a similar approach can be considered to minimize other circuit metrics such as area or power, by deriving the closed-form relation of these parameters. Please also note that even though the optimization has been performed in the context of FPGAs, it is straightforwardly applicable in more general digital circuits requiring high-performance reconfigurable routing multiplexers.

B. Electrical Simulations

In this section, we show some electrical simulations to verify the analysis developed above.

1) Methodology

Equation 6 reveals that $W_{prog,opt}$ is related to many process parameters: $V_{prog}$, $I_d$, $R_{min}$ and $C_{off}$, and some design-dependent parameters, $W_{inv}$, $C_L$ and n. Process parameters, $I_d$, $R_{min}$ and $C_{off}$, are extracted from a commercial 0.18 μm technology. As for design parameters, we refer to [13] [15] and study multiplexers for SB, CB, BLE and local routing assuming a baseline FPGA architecture. Table 1 presents the setup for the different RM-based multiplexers considered in the FPGA architecture. Winv of multiplexers in SBs, CBs and BLEs are set as 1. Winv of multiplexers in local routing is set as 2 to drive the signal from routing tracks. The load of multiplexers in BLE, CB and local routing are set as a inverter×1. In SBs, load of multiplexer is set as a inverter×10 in order to drive the large parasitic capacitance of a routing track.

TABLE 1

RM-based multiplexers in baseline FPGA architecture

| Location | No. of input | Drive inv. size | Load inv. size |
|---|---|---|---|
| Switch Block | 4 | 1 | 10 |
| Connection Box | 32 | 1 | 1 |
| Local routing | 53 | 2 | 1 |
| BLE | 2 | 1 | 1 |

The relation between the n-stage multiplexer delay and the width of the programming transistor is depicted in FIG. 6.

2) Experimental Results

With all the defined parameters above, we sweep Vdd from 0.4 V to 1.8 V and $W_{prog}$ from 1 to 3 to explore their impact on delay and EDP. The lower bound is set to 1 for the minimum width transistor. The upper bound of $W_{prog}$ is set to 3, which is the size of a pair of complementary pass transistors, to limit the area overhead.

Figure 7:
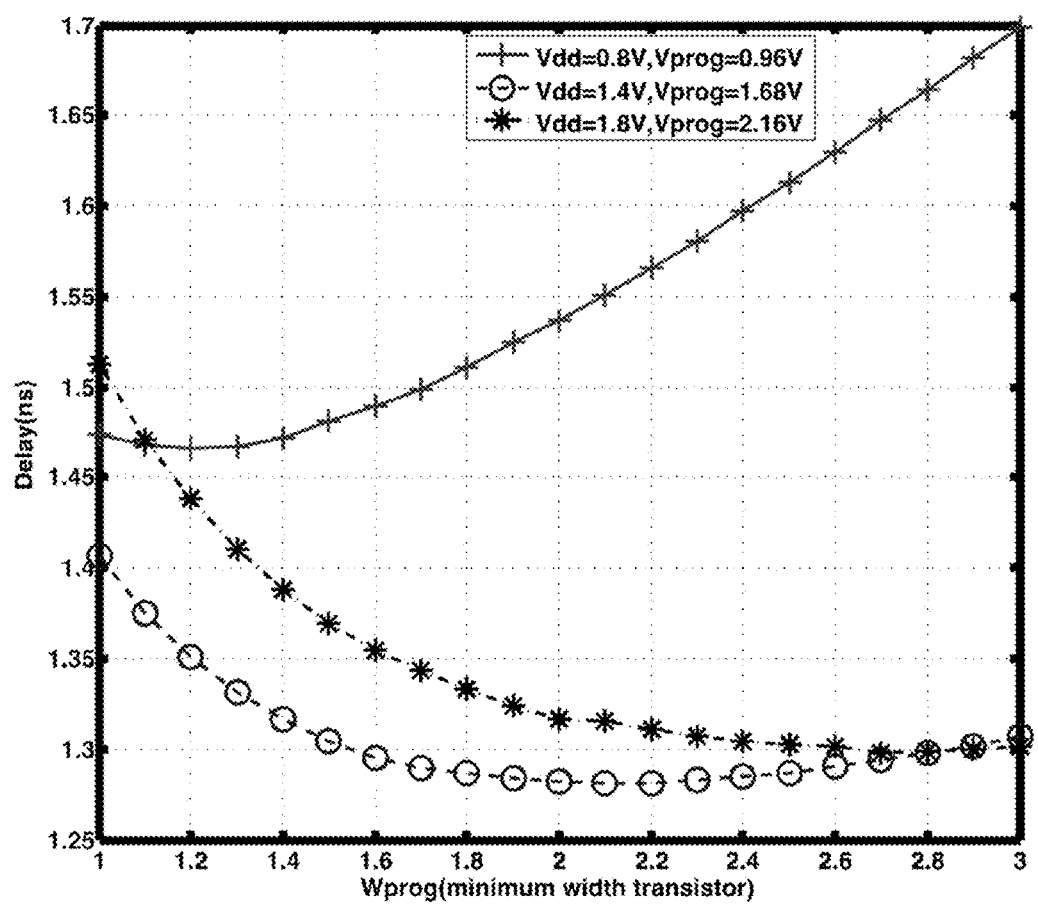
FIG. 7 contains a graph illustrating delay variations for increasing $W_{prog}$ of 32-input multiplexer.

Equation 6 predicts that when $V_{prog}$ decreases, $W_{prog,opt}$ decreases. Experimental results in FIG. 7 verify this prediction. FIG. 7 depicts the delay of a 32-input multiplexer extracted while sweeping Vdd and $W_{prog}$. The curves, obtained for Vdd=1.8 V and Vdd=1.4 V, are similar to the region pointed out by the white-headed arrow in FIG. 6. In these two cases, the best performance is achieved when $W_{prog}$=3 and $W_{prog}$=2, respectively. The curve obtained for Vdd=0.8 V corresponds to the region illustrated by a black-headed arrow in FIG. 6. In this case, the best performance is achieved when $W_{prog}$=1. When comparing the three curves, we observe that the best performance shifts from $W_{prog}$=3 when Vdd=1.8 V to $W_{prog}$=1 when Vdd=0.8 V for a 32-input RM-based multiplexer.

Figure 8:
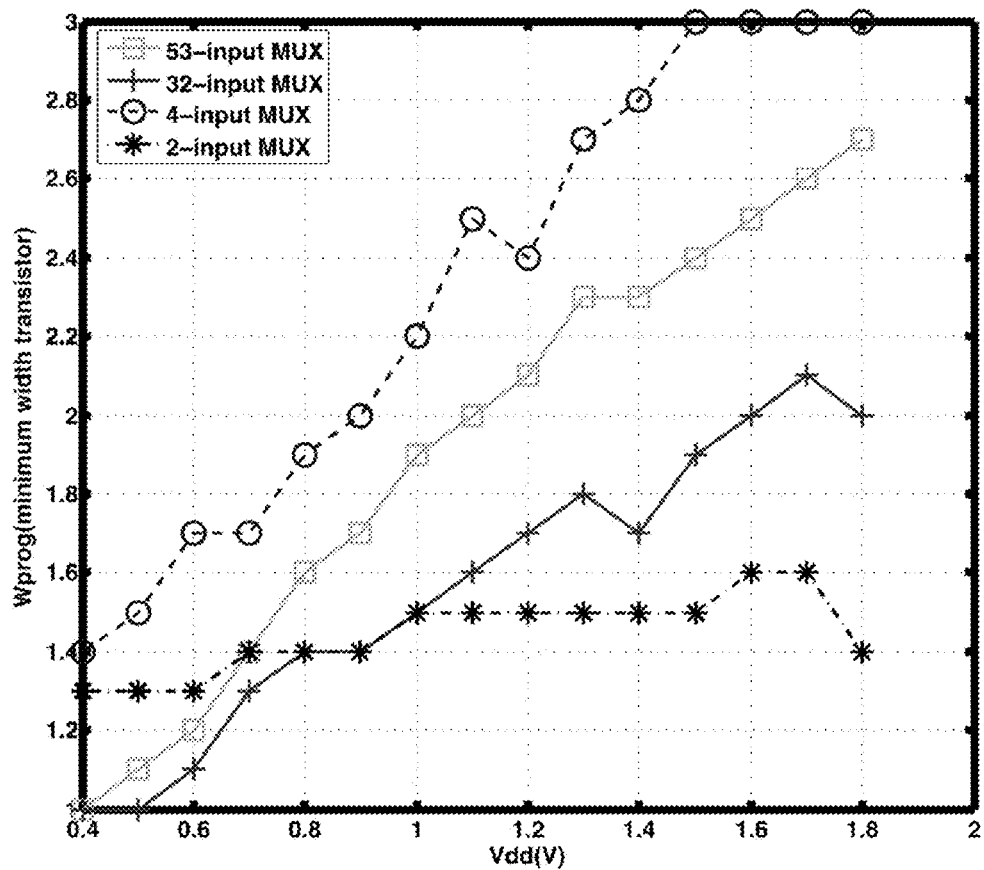
FIG. 8 contains a graph illustrating optimal $W_{prog,opt}$ (Best EDP) as a function of Vdd for RM-based routing multiplexers.

For low-power FPGAs, designers often consider the best Energy-Delay Product (EDP) as a good trade-off metrics. FIG. 8 presents the optimal $W_{prog,opt}$, i.e., leading to the best EDP, of the different multiplexers listed in Table 1 by sweeping Vdd ranging from 0.4 V to 1.8 V. Equation 6 predicts that a large capacitive load leads to a large $W_{prog,opt}$. The curve of the 4-input multiplexers in SBs, whose loads are inverters 10× verifies this prediction, where $W_{prog,opt}$ is significantly larger than the other multiplexers. Equation 6 also predicts that $W_{prog,opt}$ increases when the number of multiplexer stage increases. By comparing the curves of 32-input, 4-input and 2-input multiplexers, we remark that the $W_{prog,opt}$ of a 32-input multiplexer is the largest while a 2-input multiplexer requires the smallest $W_{prog,opt}$. Note that we determine $W_{prog,opt}$ in terms of the best EDP rather than delay. Hence, the results in the sub-Vt regime do not strictly perform as predicted by Equation 6 because the energy values dominate the EDP in the sub-Vt regime. The experimental results show that non-uniform sizes of programming transistors produce best delay and EDP. Optimal sizes of programming transistors in the multiplexers differ from their design contexts in FPGAs. For instance, the multiplexers in SBs require large programming transistors while the multiplexers in BLEs and local routing require small programming transistors. These experimental results are particularly appealing in the context of sub/near-Vt FPGAs, where the sizes of the programming transistors can be reduced, contributing to not only area-saving but also to further delay and power efficiencies. Take the example of the 4-input multiplexers in SBs. When Vdd=1.2 V is applied, compared to uniform size ($W_{prog}$=3), $W_{prog,opt}$=2.4 leads to a 20% area reduction, yet ensuring the best EDP.

Architectural-Level Simulations

In this section, architectural-level simulations are carried out to evaluate near-Vt RM-based FPGAs. First, we introduce the experimental methodology and, then, we present the experimental results.

A. Methodology

We compare the area, delay and power of four different FPGAs:

(1) the standard CMOS FPGA architecture when Vdd=1.8 V,
(2) the standard CMOS FPGA architecture when Vdd=1.2 V,
(3) the RM-based FPGA architecture using uniform programming transistor sizing at Vdd=1.2V, and
(4) the RM-based FPGA architecture using non-uniform optimized programming transistors sizing at Vdd=1.2 V.

At near-Vt regime, we select 1.2 V as Vdd, because it provides a reasonable trade-off between performance gain in RM-based routing architecture and performance degradation in logic elements. Architecture-level results are generated by VTR flow [26]. The twenty largest MCNC benchmarks [25] pass through logic synthesis by ABC [27]. VPR 7 [26] conducts the physical synthesis including packing, placement and routing. We use the Configurable Logic Block (CLB) architecture described herein above in the present description and single-driver routing architecture. For the Connection Blocks (CBs), we set Fc,in=0.15 and Fc,out=0.10. For the Switch Boxes (SBs), we use a Wilton pattern and set Fs=3. Technology parameters (area, delay and power) are extracted from commercial 0.18 μm technology.

B. Experimental Results

Figure 9:
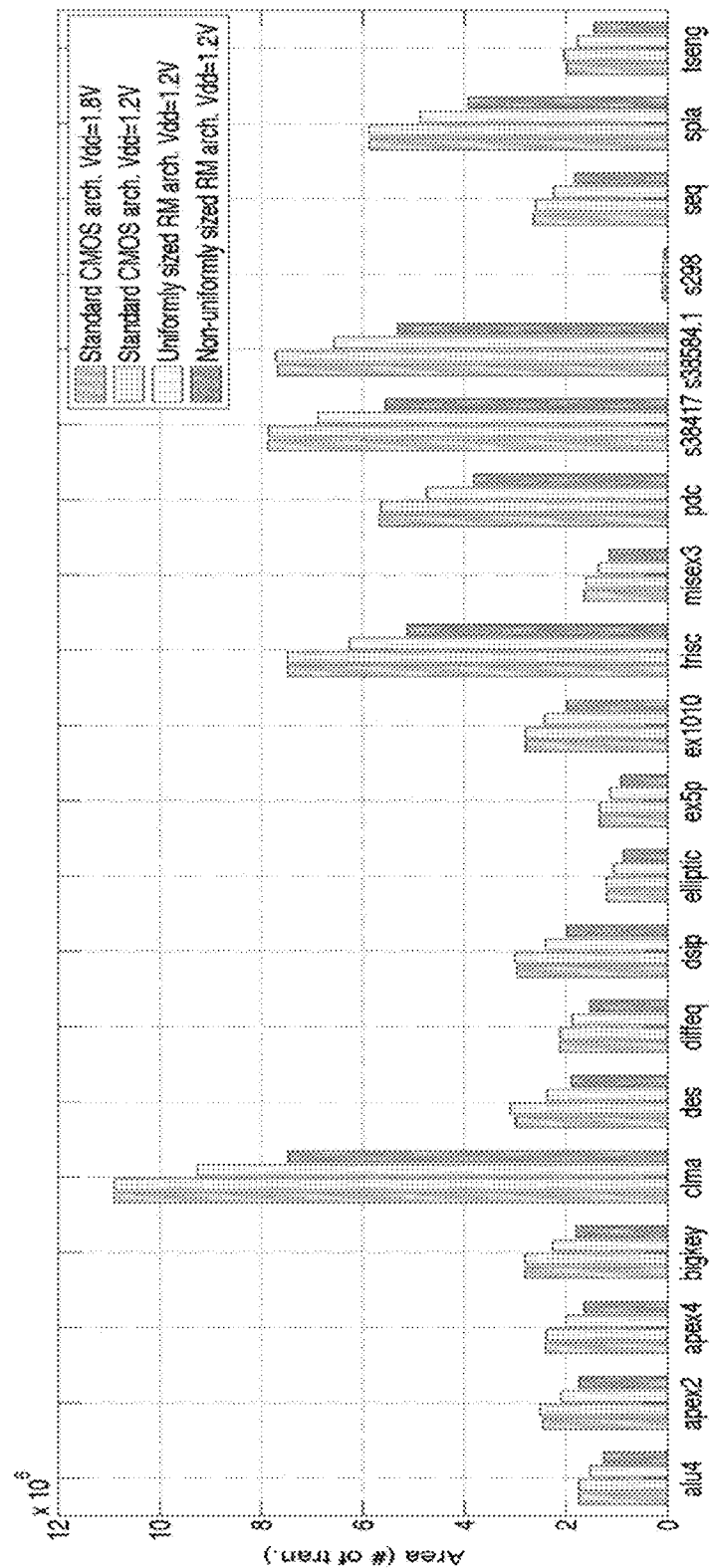
FIG. 9 contains an area comparison for 20 biggest MCNC benchmarks implemented in standard CMOS architecture at Vdd=1.8 V, standard CMOS architecture at Vdd=1.2 V, uniformly sized RM architecture at Vdd=1.2 V, and non-uniformly sized RM architecture at Vdd=1.2 V.
Figure 10:
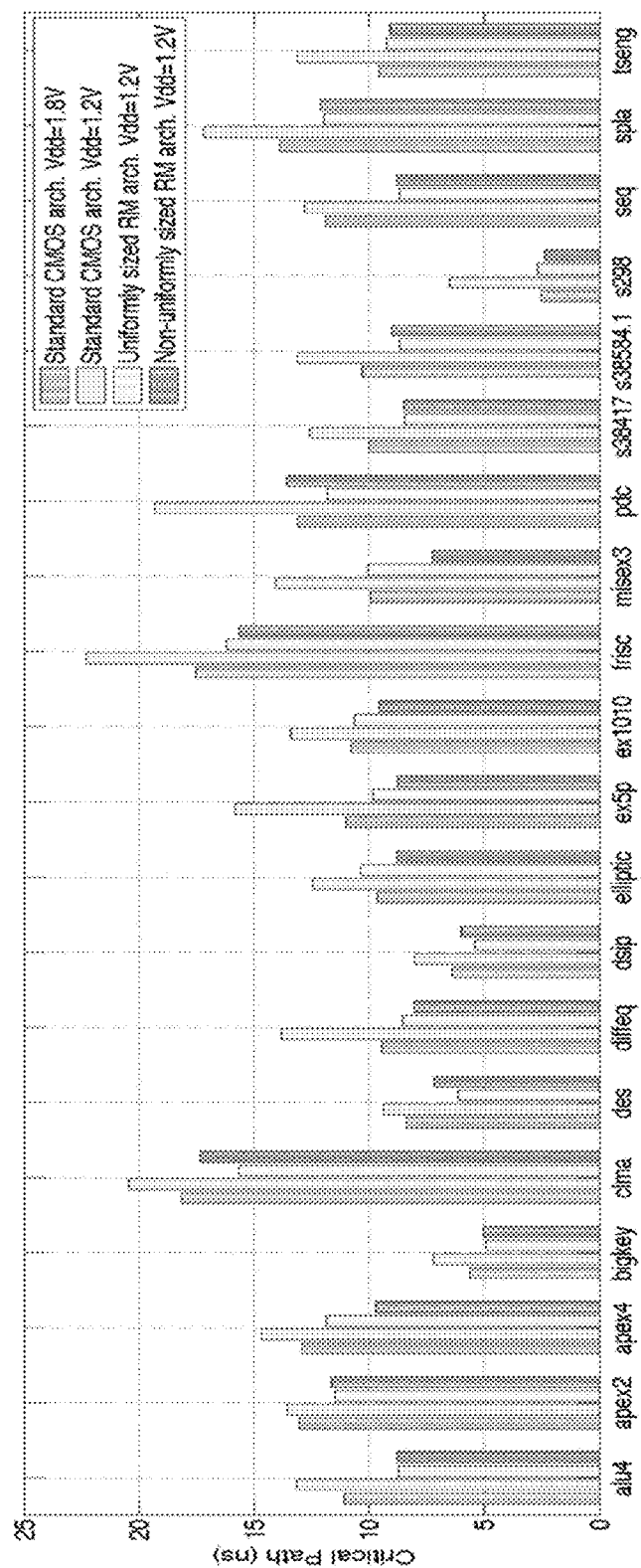
FIG. 10 contains a critical path comparison for 20 biggest MCNC benchmarks implemented in standard CMOS architecture at Vdd=1.8 V, standard CMOS architecture at Vdd=1.2 V, uniformly sized RM architecture at Vdd=1.2 V, and non-uniformly sized RM architecture at Vdd=1.2 V.
Figure 11:
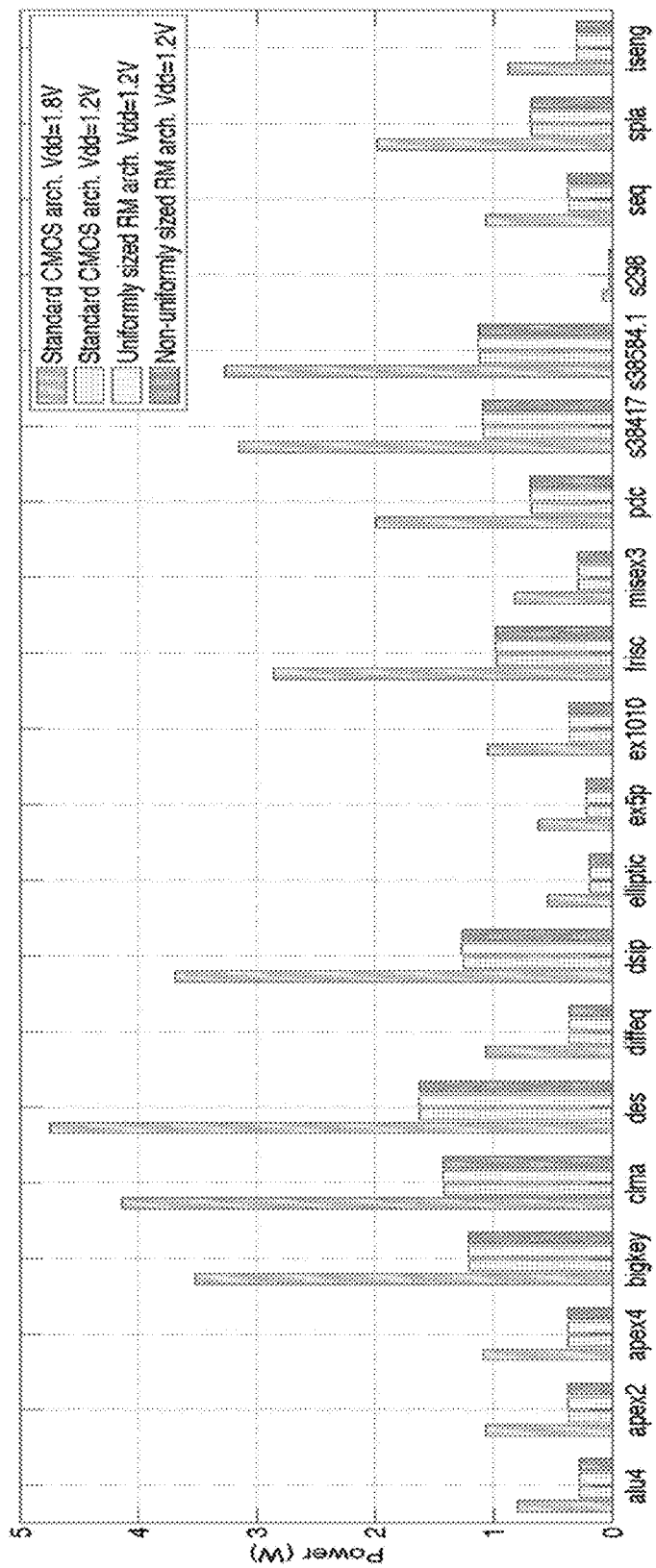
FIG. 11 contains power comparison for 20 biggest MCNC benchmarks implemented in standard CMOS architecture at Vdd=1.8 V, standard CMOS architecture at Vdd=1.2 V, uniformly sized RM architecture at Vdd=1.2 V, and non-uniformly sized RM architecture at Vdd=1.2 V.

FIG. 9, FIG. 10 and FIG. 11 show the experimental results for area, delay and power, respectively. FIG. 9 illustrates the area comparison between the four FPGA architectures. Compared to the standard FPGA architectures, the uniform programming transistor sized RM-based FPGA working at Vdd=1.2 V saves 15% area on average thanks to the BEOL technology which moves memories to the top of the chip. Compared to the uniformly sized RM-based FPGA, RM-based FPGA using the non-uniformly sized programming transistors saves further 18% area on average thanks to the reduced impact of the programming transistors in the routing structure. FIG. 10 illustrates the delay comparison between the four FPGA architectures. When Vdd drops from 1.8 V to 1.2 V, the standard FPGA architecture sees a 30% increase in its critical path delay, resulting from the degradation of driving current that transistors can provide. Compared to the standard FPGA architecture at Vdd=1.8 V, the RM-based FPGA using uniformly sized programming transistors reduces by 10% on average the delay even at Vdd=1.2 V. This comes from the high performance of the RM-based routing architecture. The RM-based routing architectures can still produce high performance at Vdd=1.2 V and even compensate the delay degradation in logic elements, leading to overall performance gain. Such a result is extremely interesting as it shows that a near-Vt RM-based FPGA is able to overperform a regular CMOS architecture working at nominal voltage. Compared to the uniformly sized RM-based FPGA, the non-uniformly sized RM-based FPGA can further improve 2% delay on average. The delay gain comes from the programming transistor sizing methodology that controls the impact of the parasitic capacitances introduced by the programming transistors and lead to the best EDP figures. FIG. 11 illustrates the power comparison between the four FPGA architectures. Both the standard and RM-based near-Vt FPGA architectures reduce on average by 65% the power consumption. This is accounted directly to the reduction of Vdd. At the same Vdd, RM-based and standard FPGAs have almost no difference in power consumption because of the similar switching capacitances in the data paths. In the logic elements, RM-based and standard FPGAs have similar switching capacitances because they share similar circuit topologies. In the RM routing architectures, the switch capacitances come from the programming transistors, while in the standard routing architecture, they come from the pass transistors. The number of programming transistors in a RM-based multiplexer roughly equals to the number of pass transistors in a standard one. Therefore, the switch capacitances in routing architectures are similar.

CONCLUSION

The present specification describes a near-Vt RM-based FPGA, where low-power can be achieved along with area reduction and performance improvement thanks to the high performance of RM-based routing architecture. Experimental results show that it improves area by 15%, delay by 10% and power by 65% as compared to the standard architecture working at nominal voltage. To push forward the area efficiency of RM-based routing architecture, we also propose a de-sign methodology to size the programming transistors of the RMs. Both theoretical analysis and electrical simulations show that non-uniform sizing gives not only area savings but also better performance and EDP than using uniformly sized programming transistors. Architectural-level simulations demonstrate optimal sized programming transistors further optimizes the near-Vt RM-based FPGA by 18% in area and 2% in delay.

REFERENCES

[1] I. Kuon et al., Quantifying and Exploring the Gap Between FPGAs and ASICs, Springer, October 2009.
[2] M. Lin et al., Performanece Benefits of Monolithically Stacked 3-D FPGA, IEEE TCAD of Integrated Circuits and Systems, Vol. 26, No. 2, 2007, pp. 216-229.
[3] L. Cheng et al., Device and Architecture Cooptimization for FPGA Power Reduction, IEEE TCAD, Vol. 26, No. 7, pp. 1211-1221.
[4] T. Tuan et al., A 90-nm Low-Power FPGA for Battery-Powered Applications, IEEE TCAD, Vol. 25, No. 2, pp. 296-300.
[5] B. H. Calhoun et al., Flexible Circuits and Architectures for Ultralow Power, Proceedings of the IEEE, Vol. 98, No. 2, pp. 267-282.
[6] H.-S. P. Wong et al., Metal-Oxide RRAM, Proceedings of the IEEE, Vol. 100, No. 6, 2012, pp. 1951-1970.
[7] G. W. Burr et al., Overview of Candidate Device Technologies for Storage-Class-Memory, IBM J. R&D, Vol. 52, No. 4/5, July/September 2008.
[8] O. Turkyilmaz et al., RRAM-based FPGA for "Normally Off, Instantly On" Applications, NANOARCH, 2012, pp. 101-108.
[9] S. Tanachutiwat et al., FPGA Based on Integration of CMOS and RRAM, IEEE TVLSI, Vol. 19, No. 11, 2010, pp. 2023-2032.
[10] J. Cong and B. Xiao, FPGA-RPI: A Novel FPGA Architecture With RRAM-Based Programmable Interconnects, IEEE TVLSI, Vol. 22, No. 4, 2014, pp. 864-877.
[11] P.-E. Gaillardon et al., GMS: Generic memristive structure for non-volatile FPGAs, IEEE/IFIP Int. Conf. on VLSI-SoC, 2012, pp. 94-98.
[12] P.-E. Gaillardon et al., Design and Architectural Assessment of 3-D Resistive Memory Technologies in FPGAs, IEEE TNANO, Vol. 12, No. 1, 2013, pp. 40-50.
[13] V. Betz et al., Architecture and CAD for Deep-Submicron FPGAs, Kluwer Academic Publishers, 1998.
[14] E. Ahmed et al., The Effect of LUT and Cluster Size on Deep-Submicron FPGA Performance and Density, IEEE TVLSI, Vol. 12, No. 3, 2004, pp. 288-298.
[15] G. Lemieux et al., Directional and Single-Driver Wires in FPGA interconnect, FPT, 2004, pp. 41-48.
[16] D. Lewis et al., The Stratix II Logic and Routing Architecture, FPGA, 2005, pp. 14-20.
[17] Altera Corporation, Stratix IV device handbook version SIV5V1-1.1, July 2008. http://www.altera.com/literature/hb/stratix-iv/stratix4 handbook.pdf
[18] Xilinx, Virtex-5 User Guide UG190 (v4.0), March 2008. http://www. xilinx.com/support/documentation/user guides/ug190.pdf
[19] M. Hutton et al., Improving FPGA Performance and Area Using an Adaptive Logic Module, F P L, 2004, pp. 135-144.
[20] W. Kim et al., Forming-free Nitrogen-doped AlOx RRAM with Sub-µA Programming Current, Symposia on VLSI, 2011, pp. 22-23.
[21] K. Huang et al., A Low Active Leakage and High Reliability Phase Change Memory (PCM) based Non-Volatile FPGA Storage Element, accepted to IEEE TCAS I.
[22] I.Kazi et al., A ReRAM-based Non-VolatileFlip-flopwithSub-VT Read and CMOS Voltage Compatible Write, IEEE NEWCAS, 2013, pp. 1-4.
[23] H. Y. Lee et al., Low Power and High Speed Bipolar Switching with a Thin Reactive Ti Buffer Layer in Robust Hf O2 based RRAM, IEDM, pp. 297-300, 2008.
[24] W. C. Elmore, The Transient Response of Damped Linear Networks with Particular Regard to Wideband Amplifiers, Journal of Applied Physics, Vol. 19, No. 1, 1948, pp. 55-63.
[25] S. Yang, Logic Synthesis and Optimization Benchmarks User Guide Version 3.0, MCNC, January 1991.
[26] J. Rose et al., The VTR Project: Architecture and CAD for FPGAs from Verilog to Routing, FPGA, 2012, pp. 77-86.

[27] University of California in Berkeley, ABC: A System for Squential Synthesis and Verification, Available online. http://www.eecs.berkeley.edu/~alanmi/abc

What is claimed is:

1. A Field Programmable Gate Array (FPGA) of the island-type comprising a plurality of cluster-based Configurable Logic Blocks (CLBs),
    wherein each of the cluster-based CLBs is surrounded by a global routing structure formed by a plurality of multiplexers and pass/transmission-gates organized in Switch Boxes (SBs) and Connection Blocks (CBs), the switch boxes and the connection blocks comprising at least a first plurality of resistive memories inserted in a data path of a first routing architecture of the switch boxes and the connection blocks,
    wherein each CLB contains Basic Logic Elements (BLEs), as well as local routing resources,
        each one of the local routing resources comprising at least a local routing multiplexer or a crossbar which route signals from the CLB inputs and the BLE outputs to the BLE inputs, each local routing multiplexer or crossbar comprising at least a plurality of Resistive Memories (RMs) inserted in a data path of a routing architecture of the local routing multiplexer, thereby being connected to inputs and outputs of the local routing multiplexer, and
    each switch box and connection block comprises at least a group of the plurality of multiplexers, arranged to realize at least an interconnection.

2. The field programmable gate array of claim 1, wherein each BLE comprises
    at least a Look-Up Table (LUT),
    a D Flip-Flop (DFF), and
    a corresponding multiplexer, which selects either a combinational version or a sequential version of the LUT output, each LUT being based on at least a plurality of non-volatile scan-chain SRAMs connected in series, and the corresponding multiplexer comprising at least a second plurality of Resistive Memories (RMs) inserted in a data path of a second routing architecture of the corresponding multiplexer.

3. The field programmable gate array of claim 2, wherein the LUT comprises a decoding multiplexer exploiting standard CMOS techniques and transistors and a plurality of storage elements exploiting at least a plurality of resistive memories,
    the decoding multiplexer being configured to route information of one of the plurality of storage elements to the LUT output,
    each one of the plurality of the storage elements comprises a flip-flop structure or a scan chain SRAM exploiting standard CMOS techniques and transistors combined with a plurality of resistive memories.

4. The field programmable gate array of claim 2, wherein for each multiplexer
    from the plurality of multiplexers forming the global routing structure,
    from the corresponding multiplexer related to each BLE, and
    from the local routing multiplexer of the local routing resources,
    the plurality of resistive memories are organized in a tree based hierarchy, and
    the field programmable gate array further comprises a plurality of programming transistors providing an access to the resistive memories during the programming phase.

5. The field programmable gate array of claim 3, wherein for each multiplexer
    from the plurality of multiplexers forming the global routing structure,
    from the corresponding multiplexer related to each BLE, and
    from the local routing multiplexer of the local routing resources,
    the plurality of resistive memories are organized in a tree based hierarchy, and
    the field programmable gate array further comprises a plurality of programming transistors providing an access to the resistive memories during the programming phase.

6. A method for configuring a Resistive Memory (RM) in a field programmable gate array of the island-type that comprises Basic Logic Elements, each of which comprises at least a Look-Up Table based on at least a plurality of non-volatile scan-chain SRAMs connected in series, each Basic Logic Element further comprising a corresponding multiplexer, wherein the corresponding multiplexer comprises at least a plurality of Resistive Memories inserted in a data path of a routing architecture of the corresponding multiplexer, the plurality of Resistive Memories including the Resistive Memory to configure, the method, comprising:
    serially loading a program bitstream to the programming scan-chain SRAMs, sequentially configuring each stage of the corresponding multiplexer,
    when a determined program bit is loaded in the programming scan-chain SRAMs for a determined stage, turning on a corresponding programming transistor of the Resistive Memory, and turning off the corresponding programming transistor after programming,
    wherein a programming voltage $V_{prog}$ for the Resistive Memory is larger than a supply voltage Vdd according to the following equation:

$$V_{prog} = \lambda \cdot Vdd$$

wherein a value of $\lambda$ must be set according to $\lambda > 1$.

7. The method of claim 6, further comprising setting $\lambda$ to 1.2, thereby providing a slack of 20% between Vdd and $V_{prog}$.

8. The method of claim 6, further comprising
    a sizing of the programming transistor to obtain an optimal size of the programming transistor, the sizing involving
        determining the size of buffers (Winv) that drive the multiplexer, a capacitive load (CL) of this multiplexer and the programming voltage (Vprog);
        determining the number of stages of the multiplexer;
        extracting process parameters (Ids, Rmin, Coff) of a transistor intended for use in a circuit design of the Resistive Memories; and
    applying $$W_{prog,opt} = \sqrt{\frac{nV_{prog}C_L W_{inv}}{(2n+1)I_d R_{min} C_{off}}}$$

to identify an optimal value of a width of the programming transistor (Wprog,opt), wherein
    $R_{min}$ denotes the equivalent resistance of a minimum size inverter, $C_{off}$ is the parasitic capacitance of a minimum width programming transistor in off state, $I_d$ is the driving current of a minimum width transistor, n is the number of stages of resistive memories on which the multiplexer is based.

* * * * *